US007143023B2

(12) United States Patent
Katz et al.

(10) Patent No.: US 7,143,023 B2
(45) Date of Patent: Nov. 28, 2006

(54) SYSTEM AND METHOD OF DESCRIBING SIGNAL TRANSFERS AND USING SAME TO AUTOMATE THE SIMULATION AND ANALYSIS OF A CIRCUIT OR SYSTEM DESIGN

(75) Inventors: Barry S. Katz, Sudbury, MA (US); Walter M. Katz, Boulder, CO (US)

(73) Assignee: Signal Integrity Software, Inc., Maynard, MA (US)

( * ) Notice: Subject to any disclaimer, the term of this patent is extended or adjusted under 35 U.S.C. 154(b) by 792 days.

(21) Appl. No.: 10/087,297

(22) Filed: Mar. 1, 2002

(65) Prior Publication Data

US 2003/0167161 A1 Sep. 4, 2003

(51) Int. Cl.
 G06F 17/50 (2006.01)
 G06F 3/00 (2006.01)
(52) U.S. Cl. .................... 703/16; 703/703; 703/17; 716/10; 716/14
(58) Field of Classification Search ............... 703/13, 703/25, 16, 17–18; 716/5, 11, 18, 10, 4; 714/733
See application file for complete search history.

(56) References Cited

U.S. PATENT DOCUMENTS

| 5,222,030 | A | * | 6/1993 | Dangelo et al. ............ 716/11 |
| 5,432,460 | A | * | 7/1995 | Flecha et al. .............. 324/754 |
| 5,623,417 | A | * | 4/1997 | Iwasaki et al. ............. 716/18 |
| 5,732,192 | A | * | 3/1998 | Malin et al. ................ 703/2 |
| 5,862,149 | A | * | 1/1999 | Carpenter et al. ......... 714/726 |
| 6,175,946 | B1 | * | 1/2001 | Ly et al. .................... 716/4 |
| 6,456,628 | B1 | * | 9/2002 | Greim et al. .............. 370/466 |
| 6,510,405 | B1 | * | 1/2003 | Gilbertson ................. 703/16 |
| 6,543,041 | B1 | * | 4/2003 | Scheffer et al. ............ 716/10 |
| 6,694,464 | B1 | * | 2/2004 | Quayle et al. ............. 714/725 |
| 2002/0112208 | A1 | * | 8/2002 | Kakizawa et al. ......... 714/738 |
| 2002/0162086 | A1 | * | 10/2002 | Morgan ..................... 716/18 |
| 2005/0204235 | A1 | * | 9/2005 | Kretchmer et al. ........ 714/733 |

* cited by examiner

*Primary Examiner*—Thai Phan
(74) *Attorney, Agent, or Firm*—Clock Tower Law Group; Erik J. Heels; Joshua D. Mather (57) ABSTRACT

A method and system and computer program product for automatically creating computer simulations or analyses of signal transfers of a circuit or system design are disclosed. A description of a physical design of a circuit or system is provided. The physical design has physical components and at least one of the physical components may transfer a signal to at least one other physical component. The physical design description includes an identification of the physical components and information descriptive of physical inter-connectivity among the physical components. A signal transfer description is provided for at least one signal transfer. The signal transfer description includes a set of source nodes and a set of receiver nodes. The set of source nodes provide the signal to be transferred and the receiver nodes receive the signal transferred from the corresponding set of source nodes. Each node is described by information associated with physical components. A signal transfer description is identified as corresponding to at least a portion of the physical inter-connectivity information. The information in the corresponding signal transfer description is used to construct computer simulations or analyses of the corresponding physical inter-connectivity.

27 Claims, 10 Drawing Sheets

SYSTEM AND METHOD OF DESCRIBING SIGNAL TRANSFERS AND USING SAME TO AUTOMATE THE SIMULATION AND ANALYSIS OF A CIRCUIT OR SYSTEM DESIGN

BACKGROUND

1. Field of the Invention

This invention relates to software tools and data structures to automate the construction and control of computer simulations and analyses of a circuit or system design.

2. Discussion of Related Art

Computer Aided Design (CAD) and electronic design automation (EDA) tools are used in the circuit design process to describe and analyze the physical arrangement of circuit components and their connections. CAD tools, for example, are used to specify a design for printed circuit boards (PCBs) and the like, by identifying the components to use in a design, their placement, and their inter-connectivity. EDA tools encompass both CAD tools and Computer Aided Engineering (CAE) tools which identify and simulate the electrical behavior of the components and their inter-connectivity.

Figure 1:
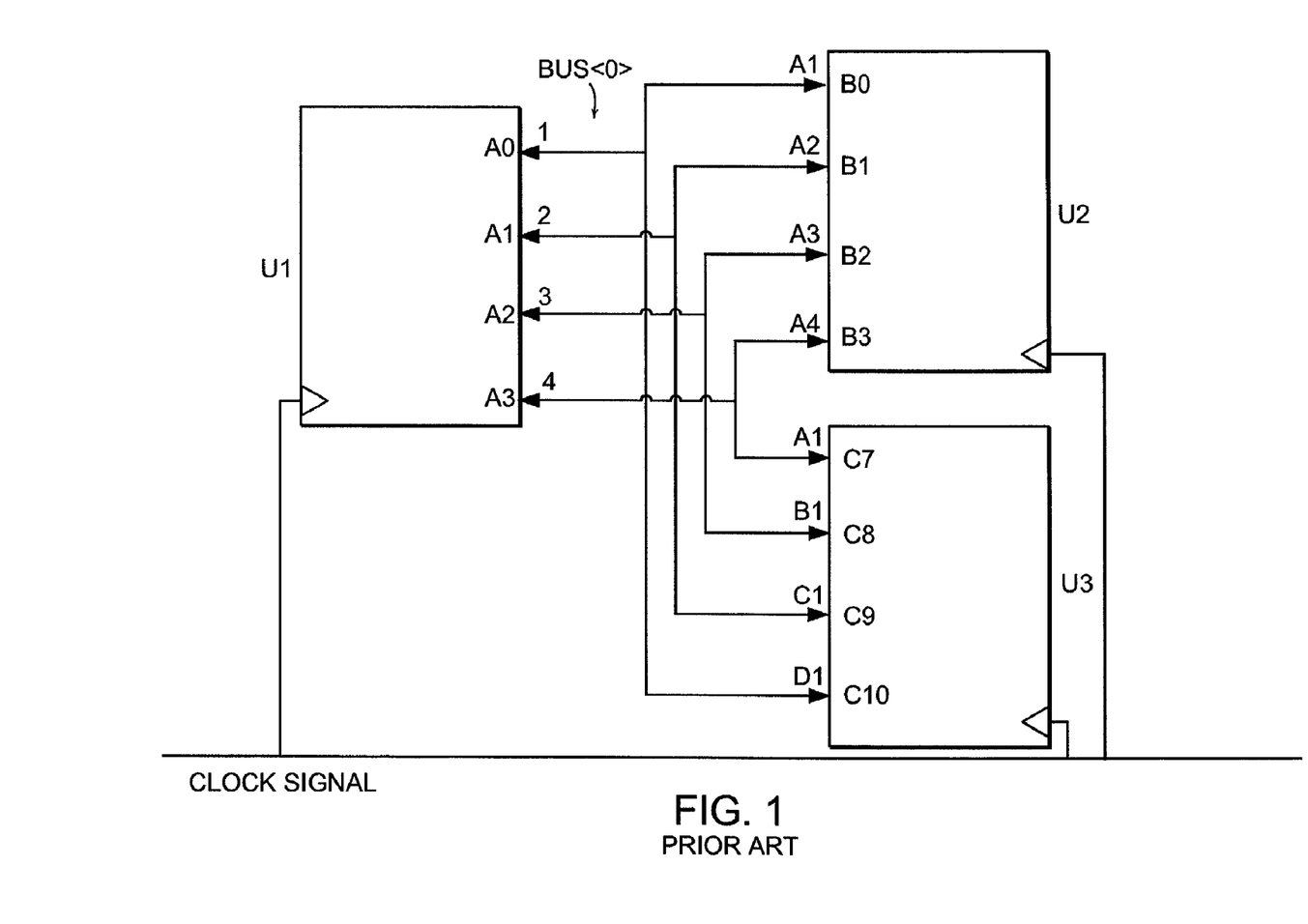
FIG. 1 illustrates an exemplary circuit or system design.

FIG. 1 shows an exemplary design having three components or parts (such as microprocessors, memory chips, etc.). The components are identified by reference designators U1, U2, and U3. Sometimes, but not always (as naming conventions and standards may vary), a reference designator is indicative of the location where a component is placed on a PCB or in a system design. Component U1 has logical pin names A3, A2, A1, A0 (which can also be denoted in bus notation as A<3:0>) and physical pin numbers 4, 3, 2, and 1 (<4:1>); component U2 has logical pin names B<3:0> and physical pin numbers A<4:1>; and component U3 has logical pin names C<10:7> and physical pin numbers D1, C1, B1, A1. The logical pin names are typically an artifact of the component vendor's naming conventions and the pins' function (e.g., a data bus), and the physical pin numbers are typically an artifact of the CAD system being used to describe and design the circuit or system. Sometimes, but not always, a physical pin number is indicative of the location where a pin is located on a component. Different implementations of the same or similar components will often have the same logical pin names but different physical pin numbers. To precisely designate a physical pin in the physical design of the circuit or system, the reference designator and physical pin number are typically used, e.g., U1.4. (It is well known that the terms "physical pin numbers" and "logical pin names" actually refer to various forms of alphanumeric strings, including those recognized by various standards, such as JDEC, and those established by vendor naming conventions. It is also understood that some technologies do not actually employ pins per se but the term pin is still used to refer to the connection mechanisms.)

The components U1, U2, and U3 are interconnected via physical nets. Bus<0>, for example, is the physical net interconnecting U1.1, U2.A1, and U3.D1. Any electrical signal on such a physical net will be communicated to all such pins, though the actual waveform may differ at different pins.

Figure 3:
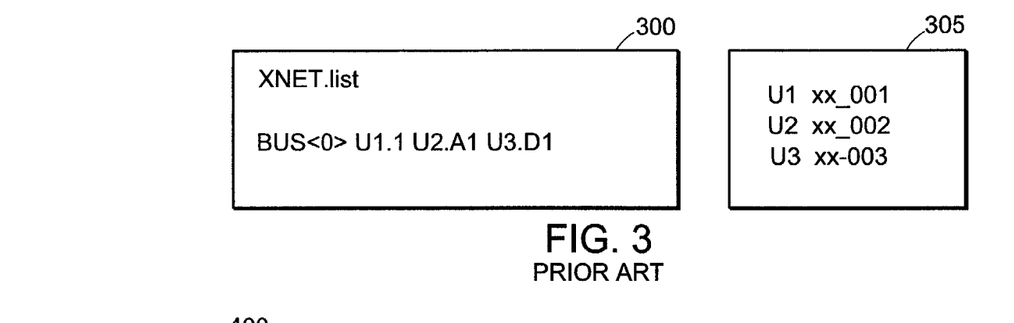
FIGS. 3 and 4 illustrate representative portions of prior art CAD files and/or data structures.

Typical CAD systems create and maintain a data structure called a physical net list to describe the inter-connectivity of the components. For example, FIG. 3 illustrates a portion of an exemplary CAD file or data structure 300 to describe the physical nets of FIG. 1. The file 300 specifies that physical net Bus<0> interconnects U1.1, U2.A1 and U3.D1. Similar descriptions would exist for the other physical nets.

Figure 2:
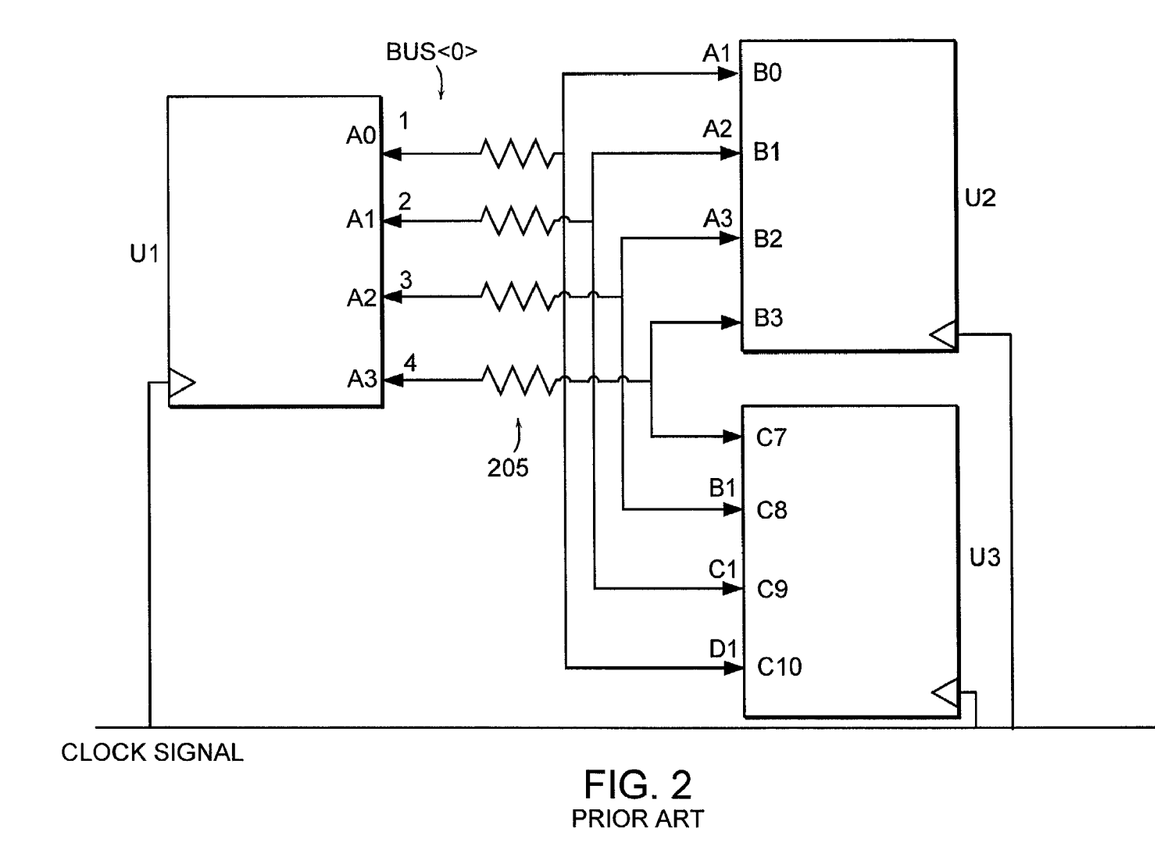
FIG. 2 illustrates an exemplary circuit or system design and including an exemplary extended net.

FIG. 2 shows a circuit similar to that of FIG. 1, except that the interconnection of components includes other devices. Two or more CAD nets sometimes perform such that a signal generated by a component on one of the CAD nets is propagated to a component on one of the other CAD nets. More specifically, the interconnections of this exemplary design include resistors, though other components such as connectors, cables, capacitors, diodes, FET switches or the like could have been included on the interconnections without loss of generality. The interconnection 205 is at times referred to as an "extended net," "electrical net," or the like. (As a shorthand, the terms "extended net" and "physical net" will be used herein.) The EDA system typically models an extended net to accurately describe its behavior. For example, in the case of FIG. 1, the system may model the metalization used to form a physical net Bus<0> as a function of the materials used, the length and shape of metalization segments to pins, etc. The extended net 205 of FIG. 2 may have a more complicated model than that of FIG. 1 to account for the other devices in the extended net.

FIG. 3 also shows a portion of a typical CAD file or data structure 305 known as a CAD parts list. Various reference designators, e.g., U1, are associated with a corresponding corporate part number, e.g., xx_003. The corporate part number identifies the part. Part xx_003 could be the corporate part number for a specific brand and model of a microprocessor chip, for example. (Sometimes companies use component vendor part numbers instead of corporate part numbers. In any case, the corporate part number is the part number used in the CAD system and is also called a CAD part number.)

To ensure that the components of a circuit or system design will inter-communicate correctly, various types of CAD and EDA tools (i.e., computer simulations) are used to ensure signal integrity and the like. This is because the signals that travel between input/output connections (IOs) or pins are distorted by the electromagnetic effects of the interconnect between the IOs and other physical phenomena or environment conditions.

Two typical types of signal integrity analysis are timing analysis and waveform analysis. Timing analysis tools, for example, analyze the simulated transfer of signals between components to ensure that certain criteria, such as "set up times" and "hold times," are satisfied. Such tools typically employ one or more forms of circuit models and/or timing specifications to describe how components behave and to specify the various timing criteria and constraints. Two typical forms of simulation models are behavioral and transistor-level models. Behavioral allows the fastest simulation times, but transistor level models are often required for design accuracy. Models are usually available in one of these two formats. An example of an industry standard behavioral model would be an IBIS model. An example of an industry standard transistor model would be an SPICE model. Waveform analysis may be done by a designer via visual inspection of simulation results or with the assistance of software tools. Typically, waveform analysis tries to detect instances when specified signal criteria are satisfied or violated. For example, a check may be made if a signal at a given pin exceeds certain levels and thus creates something known as an overshoot condition.

Figure 4:
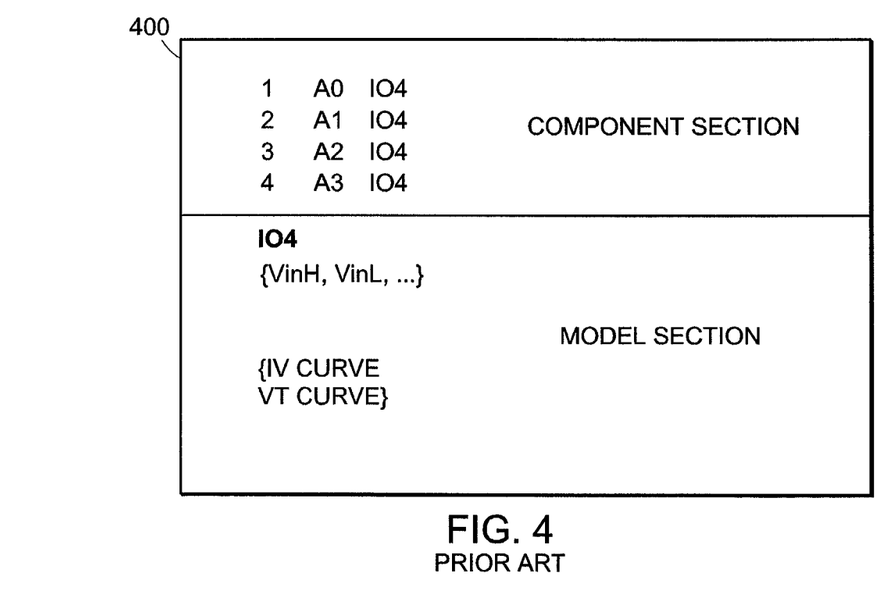

FIG. 4, for example, shows portions of an IBIS file or data structure 400. The file 400 is associated with a specific component part and is often provided by the component vendor. In this example, the file 400 is for part xx_003. The model 400 is composed into a component section and a model section. The component section, among other things, specifies the physical pin number, e.g., 1–4, the associated logical pin names, e.g., A<3:0>, and identifies an IO buffer model for each pin. In this example each pin is associated with model IO4. The model section more specifically recites the various parameters and model information to describe the electrical behavior of the component pins, for example, specifying IV (current/voltage) and VT (voltage/time) curves or the like. Transistor level models are often considered to be a more accurate representation of how a component pin actually behaves as it models the actual pin at a transistor-level of operation.

One method of simulating and analyzing the behavior of a design is to exhaustively simulate and analyze all interconnections. For example, a designer or tool can cause the simulation and analysis of U1.1 driving a signal to U2.A0 and vice versa; U1.1 driving a signal to U3.D1 and vice versa; and U2.A0 driving a signal to U3.D1 and vice versa. The simulation tools would use the IBIS model and/or SPICE models discussed above (or perhaps other models) to simulate how the component pins behave.

The exhaustive approach often causes the simulation of "paths" that in fact are never expected to be used in the actual design. These are known as "false paths." For example, assume that U1 is microprocessor and U3 is a register, and that the logical behavior of each component and its interfaces make U3 incapable of driving a signal to U1. The exhaustive approach would nonetheless simulate U3 driving U1, and such an approach may flag such a path as violating timing or other signal integrity criteria. A designer would then need to address such an error. For example, the designer could fix the problem by adding passive components to the extended net violating the criteria, or by changing the location of components, even though the path is never expected to be used. Or, the designer may study the logical design of the system in an attempt to determine whether or not the flagged path is a true or false path (sometimes this option is not practical or available). In either case, these approaches are wasteful of designer time and simulation time, and error prone.

Another approach to simulating the design is to have a designer familiar with the logical design of the system architecture (e.g., someone who knows that U3 never drives U1) construct the appropriate simulations and analyze the resulting waveforms. This approach is wasteful of designer time and error prone. It also requires such analysis to be performed by someone familiar with the logical design and, thus, potentially requires inefficient allocation of engineering talent. Moreover, if a design or component is changed (e.g., substituting one model of processor for another) or is re-characterized (e.g., a modified model is used to more accurately describe electrical behavior of a component already in the design), the simulations need to be reconstructed and analyzed by the designer.

SUMMARY

The invention provides a method and system and computer program product for automatically creating computer simulations or analyses of signal transfers of a circuit or system design.

Under one aspect of the invention, a physical design has physical components and at least one of the physical components may transfer a signal to at least one other physical component. The physical design description includes an identification of the physical components and information descriptive of physical inter-connectivity among the physical components. A signal transfer description is provided for at least one signal transfer. The signal transfer description includes a set of source nodes and a set of receiver nodes. The set of source nodes provide the signal to be transferred and the receiver nodes receive the signal transferred from the corresponding set of source nodes. Each node is described by information associated with physical components. A signal transfer description is identified as corresponding to at least a portion of the physical inter-connectivity information. The information in the corresponding signal transfer description is used to construct computer simulations or analyses of the corresponding physical inter-connectivity.

Under another aspect of the invention, design libraries having information descriptive of physical components may be validated. The design libraries include information identifying input and output pins of a component. A signal transfer description is provided for at least one signal transfer for a circuit or system design. The signal transfer description includes a set of source nodes and a set of receiver nodes. The set of source nodes provide the signal to be transferred and the receiver nodes receive the signal transferred from the corresponding set of source nodes. Each node is described by information associated with physical components. A physical component is identified corresponding to a source node in the signal transfer description, and a set of pins are identified for the identified physical component that correspond to the source node. All pins identified as corresponding to the source node are verified to determine whether they are capable of being an output device. A physical component is identified as corresponding to a receiver node in the signal transfer description, and a set of pins are identified for the identified physical component that correspond to the receiver node. All pins identified as corresponding to the receiver node are verified to determine whether they are capable of being an input device.

DETAILED DESCRIPTION

Preferred embodiments of the invention provide a way to automate the creation and control of signal integrity simulations and analyses of circuit or system designs. Under certain embodiments of the invention, a component may be replaced by another component in a circuit or system design, or a component may be re-characterized, and the corresponding simulations and analyses to verify such modifications may be created automatically. Consequently, design modifications may be verified more quickly, reliably, and efficiently. Certain preferred embodiments facilitate the automatic creation and control of signal integrity simulations and analyses, while avoiding the simulation or analysis of "false paths." In doing so, they utilize engineering time and computer simulation time more efficiently.

The formalized descriptions so created are re-usable. Even if the underlying physical components and connectivity are changed, the transfer nets may be re-used to automate the simulation and analysis of subsequent designs, so long as the transfers so described and modeled by the transfer nets and other data structures remain unchanged.

Figure 5:
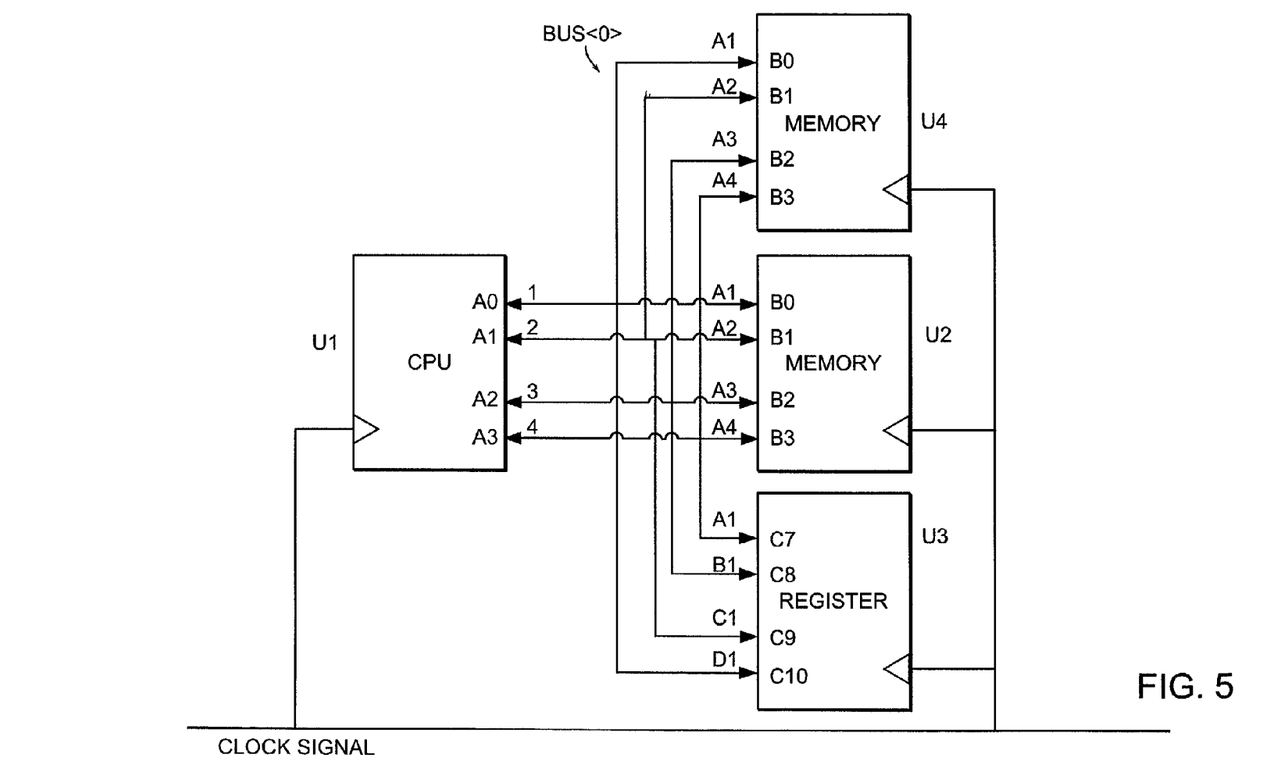
FIG. 5 illustrates an exemplary circuit or system design.

FIG. 5 is an exemplary physical design similar to the design of FIG. 1 except that it includes another component U4. Moreover, the type of component is also indicated in the figure for descriptive convenience and cross referencing purposes with subsequent description of embodiments of the invention. (These labels do not exist in conventional physical CAD system descriptions of a physical design.) For example, U1 is labeled as a CPU; U3 is a Register; and U2 and U4 are Memory chips.

Figure 6:
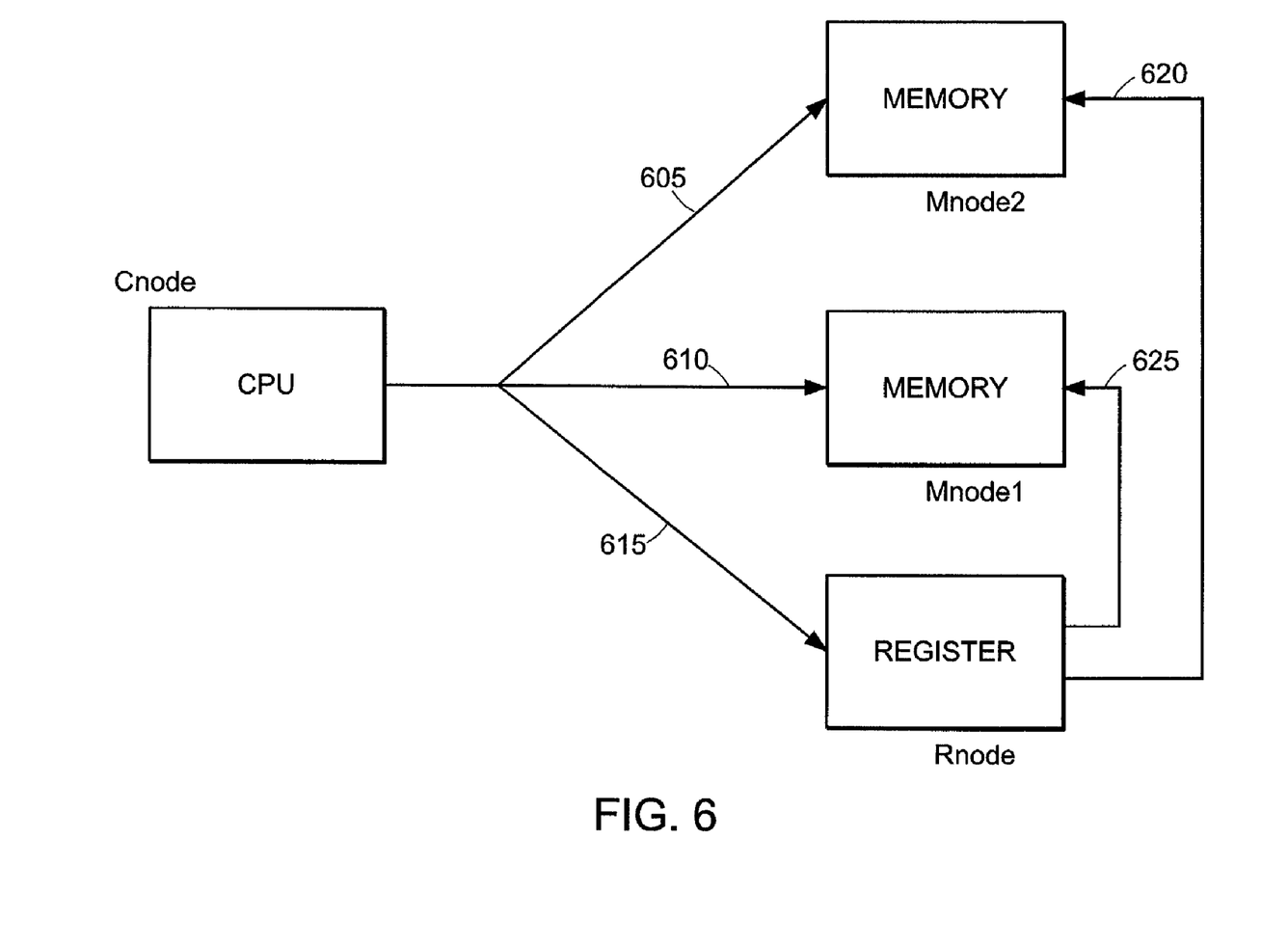
FIG. 6 illustrates an abstract model of signal transfers of an exemplary circuit or system design.

Under certain embodiments of the invention, a designer models the transfers that actually occur within a system to facilitate subsequent automatic creation and control of signal integrity simulations and analyses. For example, part of the design of FIG. 5 may be abstractly or conceptually modeled as shown in FIG. 6. The components are identified as corresponding nodes, e.g., Cnode, Mnode 1, Mnode 2, and Rnode, and each node has an associated abstract type suggestive of its functionality, e.g., CPU, Memory, Register. The direction of the arrows at the end of the transfer links 605–625 indicate the source and receiver of a signal transfer. For example, transfer 605 indicates that the Cnode is the source and Mnode 2 is the receiver. In other words, the component corresponding to Cnode can drive signals to the component corresponding to Mnode2, which can then receive and use such signals. By inspection of FIG. 6, one can see that the system has Cnode 1 drive signals to Mnode 1, or Mnode 2, or Rnode, but not vice versa, and that Rnode may drive signals to Mnode 1 or Mnode 2 but not vice versa. Notice the transfers are not indicative of actual connectivity, and signal transfers should not be confused with connectivity. When Cnode drives a signal to Mnode 2 that signal is communicated in some form (i.e., waveforms may differ) to all component pins on the relevant extended net. (FIG. 5 shows the connectivity of the system modeled by FIG. 6.)

To represent such a model of the actual transfers in software logic, certain embodiments of the invention create and use a computer-readable data structure referred to herein as a "transfer net." The term "transfer net" is used to distinguish it from a "physical net" or an "extended net", which lacks information about transfers or functionality and instead simply describe electrical connectivity.

Figure 7A:
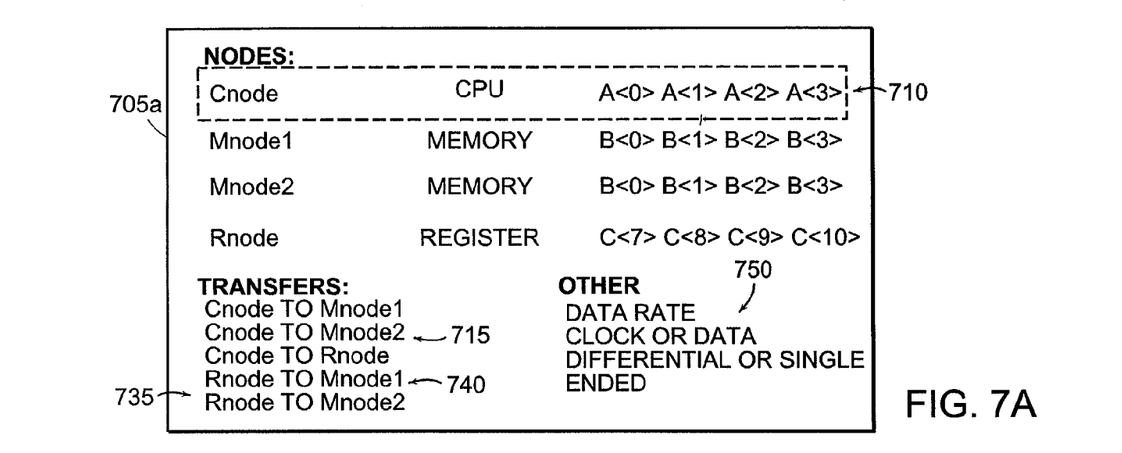
FIGS. 7A–B are exemplary transfer net data structure according to certain embodiments of the invention.
Figure 7B:
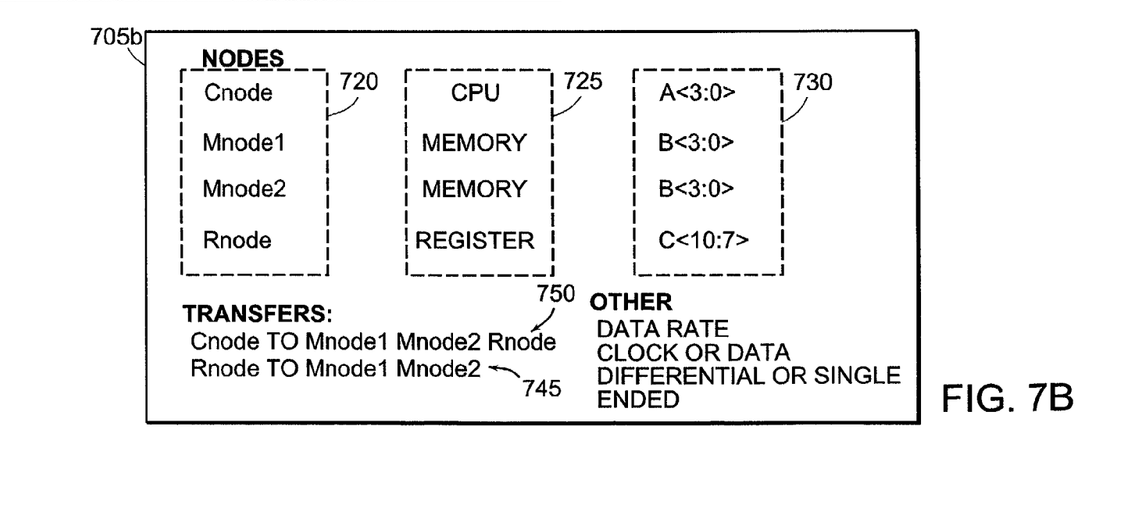

FIGS. 7A–B are alternative, exemplary forms of a transfer net description 705 for the circuit or system design of FIG. 5 or 6. Transfer nets 705A and 705B differ in syntax but not in substance. The transfer net description 705 includes descriptions of nodes 710 and signal transfers 715. Each node 710 includes a node ID 720, a part ID 725, and a pin definition (pindef) 730. There are several shorthand standards for describing pindefs using bus notation. In this embodiment, A<0> is equivalent to A0, and is a member of the pindef A<3:0> as well as A<0:3>. The order of the pins in a pindef could be used in certain embodiments of this invention. Under certain embodiments, the part ID 725 is an abstraction and not a name or ID used by the physical CAD system (i.e., it is not a corporate part number or a reference designator). As will be explained below, this facilitates the re-use of transfer nets even if components are changed from one design to another. Though physical pin numbers or arbitrary identifiers could be used, under certain preferred embodiments, including the illustrated embodiments of FIGS. 7A–B, pindefs 330 are logical pin names. Logical pin names are used because they do not typically vary between different implementations of the same part (whereas physical pin numbers may). Thus, logical pin names facilitate the re-usability of transfer nets.

Each transfer 715 specifies a source 735 and a receiver 740. A source 735 may have a multiplicity of node IDs 720, though in this example only one is shown. Similarly, a receiver 740 may have a multiplicity of node IDs 720. A source has its corresponding pins send data in an actual design. A receiver has its corresponding pins receive data in an actual design. Though not explicit in the transfer 715, but implicit and derivable therefrom, an extended net also has "other" types of pins or nodes. "Other" is used to refer to pins that are on the extended net that is driven by a driver but they are not receivers; consequently the "other" pins are subject to the driven electrical signals though they do not utilize them in the transfer. By inspection of FIGS. 6 and 7A–B conjointly, one can see that the transfers conceptually modeled are described in the transfer net transfers 715.

Though not shown in FIGS. 7A–B, certain embodiments allow a designer to arrange transfer net structures into transfer net lists. For example, a designer of a PCB or other circuit or system design, may model various transfers in a meaningful way, and arrange the various transfers of the overall design as one transfer net list. One transfer net list may be made for a CPU's external cache interface, and another transfer net may be made for the CPU's system bus interface. Each may have their own corresponding, related transfers. Moreover, there is no requirement that every physical net have a corresponding transfer net; for example, a designer may not desire a transfer net for physical nets that distribute power to the circuit or system design. In short, under certain preferred embodiments, the transfer net lists are designer dependent.

Figure 8:
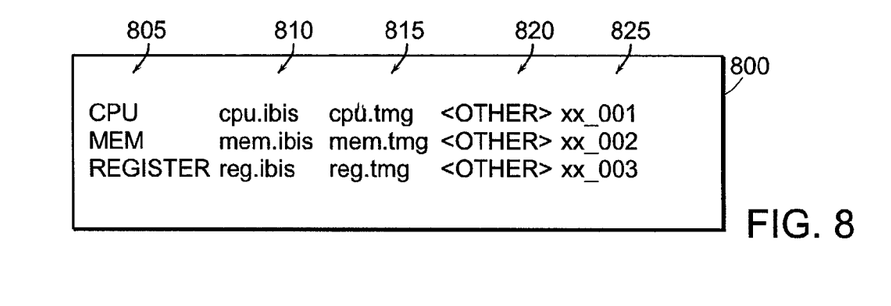
FIG. 8 illustrates a representative portion of a part mapping data structure and/or file according to certain embodiments of the invention.
Figure 9:
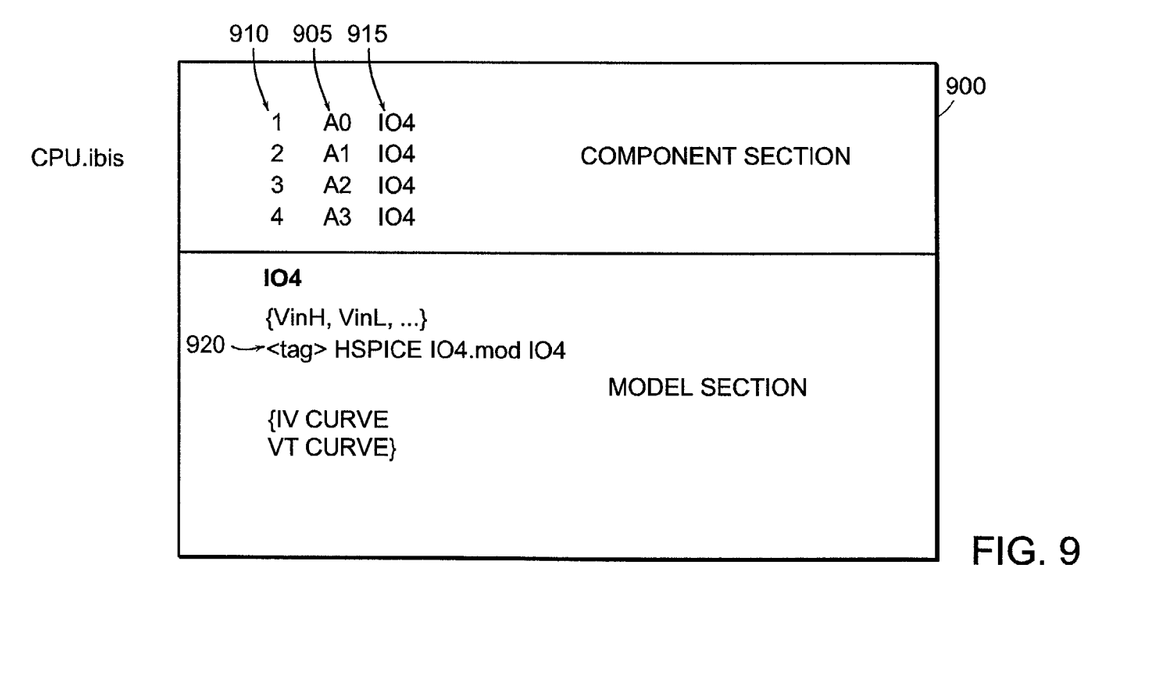
FIG. 9 illustrate representative portions of a modified CAD file and/or data structure according to certain embodiments of the invention.

Under certain preferred embodiments, other data structures are also used to facilitate reusability of transfer nets and to leverage existing CAD infrastructure. FIG. 8, for example, illustrates a portion of a computer-readable data structure referred to herein as a "part mapping data structure" 800. This structure associates an abstract part ID 805 (e.g., CPU, Memory, Register) with a behavioral model 810 (e.g., cpu.ibs), a timing specification file 815 (e.g., cpu.tmg), and other files 820 as needed. The above information is also further associated with a corporate part number 825 for the actual physical component to be used (e.g., xx_003). FIG. 9 illustrates a portion of an IBIS file 900 (CPU.ibs) that has been modified to include certain information to benefit certain embodiments of the invention, while also leveraging the existence of such structures in many typical CAD systems. Like a conventional IBIS file, file 900 associates logical pin names 905 and physical pin numbers 910 in the component section, along with an IO buffer model ID 915. Unlike conventional files, file 900 specifies other simulation models and files in the model section and flags such with appropriate comment tags 920 detectable by file parsing logic. In this example, the other simulation models include SPICE models, which by its placement in the file is associated with the IO buffer model IO4.

Figure 10:
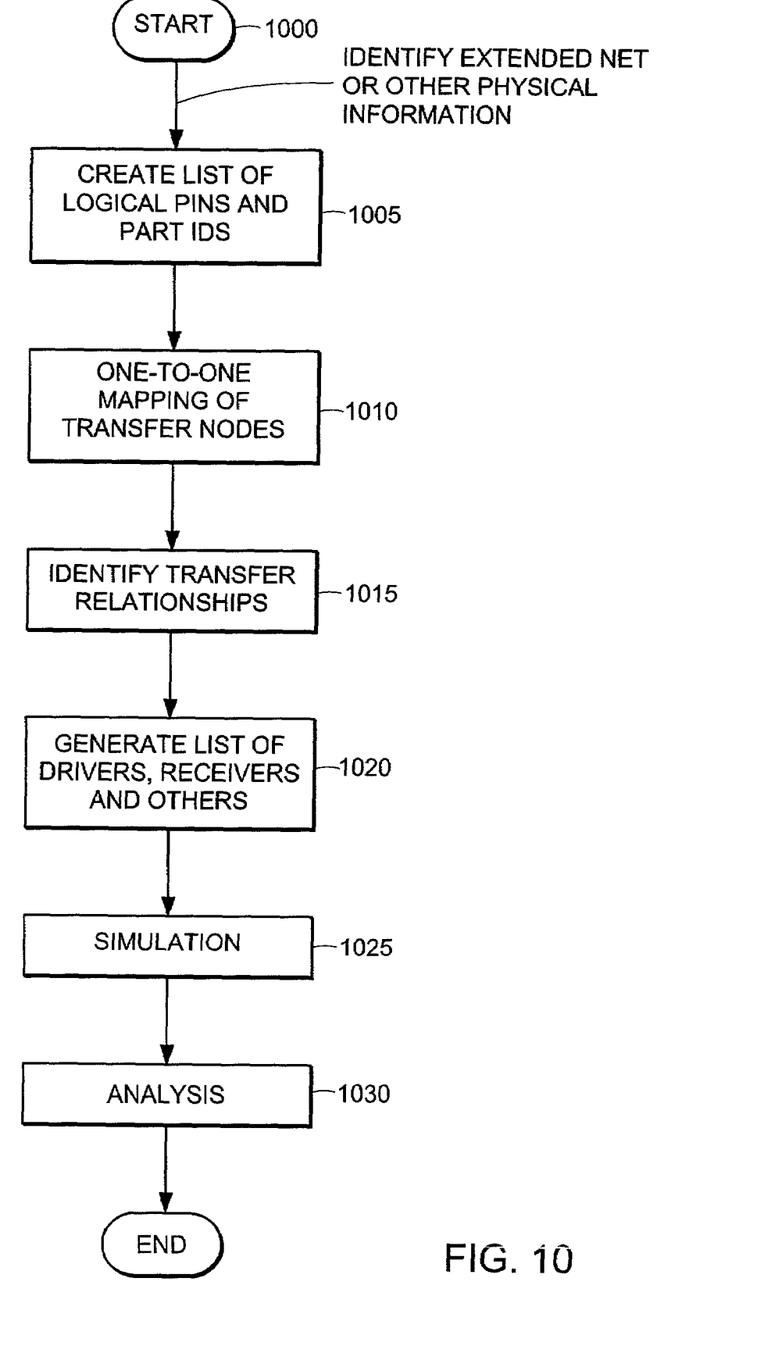
FIG. 10 is a flowchart illustrating an exemplary manner in which transfer net descriptions may be used to automate the creation and control of signal integrity simulations and analyses according to certain embodiments of the invention.

FIG. 10 is a flowchart illustrating exemplary logic that uses transfer nets, and transfer net lists, to automate the construction and control of signal integrity simulations and analyses. In this example, the starting point 1000 assumes that particular physical information has been identified as of interest, e.g., a particular net such as Bus<0>. As will be explained below, the logic identifies the transfer net that corresponds to that extended net, and once such correspondence is found, the transfer net information is used to construct and control signal integrity simulations and analyses for such extended net. The simulations and analyses so constructed avoid the simulation or analysis of false paths.

Once an extended net is identified, the logic creates a list of logical pin and part identifications at act 1005. For example, extended net Bus<0> would be specified as associated with physical information U1.1, U2.A1, U3.D1, and U4.A1 via a conventional physical or extended net (see, e.g., item 300 of FIG. 3). A CAD parts list could then be consulted using the reference designators, e.g., U1 to find the corresponding associated corporate part numbers, e.g., xx_001 (see, e.g., item 305 of FIG. 3). The corporate part number may be used to find corresponding entries in the part mapping data structure 800. For example, corporate part number xx_001 is associated with IBIS file 810 "cpu.ibs" and is also associated with a part ID 805 "CPU." The logic may consult and parse the corresponding IBIS file 900 (shown in relevant part in FIG. 9) to find corresponding logical pin names 905; e.g., physical pin 1 is associated with logical pin A0. Thus, U1.1 could be associated with a part ID CPU and a logical pin A0. The logic would do the above for each pin in the net of interest. Thus, U2.A1 would associate with a part ID Memory and logical pin B0; U3.D1 would associate with a part ID Register and logical pin C10; and U4.A1 would associate with a part if of Memory and logical pin B0.

The logic then iterates 1010 through the transfer net list to find the particular transfer net description that corresponds to the identified physical information. In certain embodiments such correspondence is found by identifying a one-to-one mapping between the pins and part ids found for the extended net and the nodes 710 of a transfer net 705. Under certain preferred embodiments, a pin in an extended net is considered to map to a node 710 in a transfer net 705 if (a) the part ID of the pin, e.g., CPU, is the same as a part ID 725 of a node 710, and (b) the logical pin name of the extended net, e.g., A0, is within the pindef 730 of the node 710. The specific logic of act 1010 is described in more detail below.

The result of the searching of act 1010 is that U1.1 will map to Cnode; U2.A1 will map to Mnode 1; U3.D1 will map to Rnode; and U4.A1 will map to Mnode 2. Since every pin in the extended net maps to a unique node in the transfer net (and vice-versa) the mapping is considered to be one-to-one. Moreover, the logic would determine that extended net Bus<0> maps to the transfer net 705.

The logic in act 1015 then analyzes the described transfers 715 in transfer net 705 to identify the transfer relationships.

As shown in FIG. 7A, the transfer relationships identify sources to the left of the word "to" and receivers to the right.

In act 1020, a list is made of all of the possible source (drivers) and furthermore, a list is made for each of these sources (or "drivers") 735 containing all of the receivers for that source (driving) node. Thus, one list would be made for Cnode, and another list would be made for Rnode. For each such list, the logic identifies corresponding receivers (or "targets") 740. Thus, in the Cnode list, the receivers would specify Mnode1, Mnode2, and Rnode, and in the Rnode list, the receivers would specify Mnode1 and Mnode 2. In each instance, "other" node type nodes would be included as well. Under certain embodiments, "other" is used to specify nodes on the same extended net, but which are not receivers for the source, for that transfer. For example, when Cnode is a source and Mnode 1 is a receiver, Mnode 2 and Rnode would be specified as other. In short, "other" are the remaining elements in the set of nodes described in a transfer net but which are not specified as a source or receiver for a particular transfer.

In act 1025, signal integrity simulations are automatically constructed using the lists constructed in act 1020 and possibly using designer specified parameters (e.g., to select the type of models to use, such as IBIS or SPICE). For example, a simulation construction tool could consult the part ID for Cnode to determine it is associated with logical part ID CPU, and then it could use part ID CPU to consult the mapping data structure 800 to identify cpu.ibs as a relevant model file. Depending on the desired simulation, either the IBIS model contained in such file could be used to help construct the simulation or other model information could be used. For example, logical pin A0 could be mapped to the IBIS model IO4 specified as associated in file 900. Or, the tags in the IBIS file could be parsed to find other model information, such as SPICE models for the same driving pin. (Of course, such SPICE model identification information may be placed in locations other than in the IBIS model; for example it may be placed in the mapping structure 800.) The logic would also find the associated model information for the receiver node, e.g., Mnode 1, the "other" nodes and for the extended net itself (to model the net itself). A simulation may thus be constructed and triggered with Cnode as the driver and the receiver and other nodes at appropriate segments on the modeled extended net. In preferred embodiments of this invention, the data structure for each transfer net would contain additional information 750 that may be useful in generating these simulations (e.g. data rate, is it clock or data, is it singled ended or differential). This construction would then be repeated for all described and relevant transfers and pins. For example, if only Bus<0> were identified, then the various transfers 715 would be constructed for the pins relevant to this net. On the other hand, if extended nets Bus<3>, Bus<2>, Bus<1> and Bus<0> were identified the process would be repeated for all of the specified extended nets. By describing the actual transfers 715, simulations of false paths are avoided.

In act 1030, signal integrity analysis tools may be automatically controlled to analyze the results of the simulations, using the information in the various data structures and lists and possibly using designer specified parameters (e.g., to select the type of analysis, such as timing analysis on all receivers, or waveform analysis on all nodes). For example, a simulation may be constructed with Cnode driving Mnode 1. Simulation results of each pin may be analyzed using rules determined by both the model data (typically found in an IBIS file) and how the pin is used in the transfer net. Typically overshoot rules would be applied to driver, receiver and other nodes since overshoot is a condition that effects the lifetime of an integrated circuit. Edge rate, and other transition rules would apply at receiver pins only. Monotonic rules might apply at receiver pins of clock nets only. As another example, timing analysis tools may be triggered to analyze the results of simulation to determine that pre-specified timing constraints are satisfied. The relevant constraints may be checked against the receiver pins of the simulation, as these are the only relevant pins for such analysis.

Figure 11:
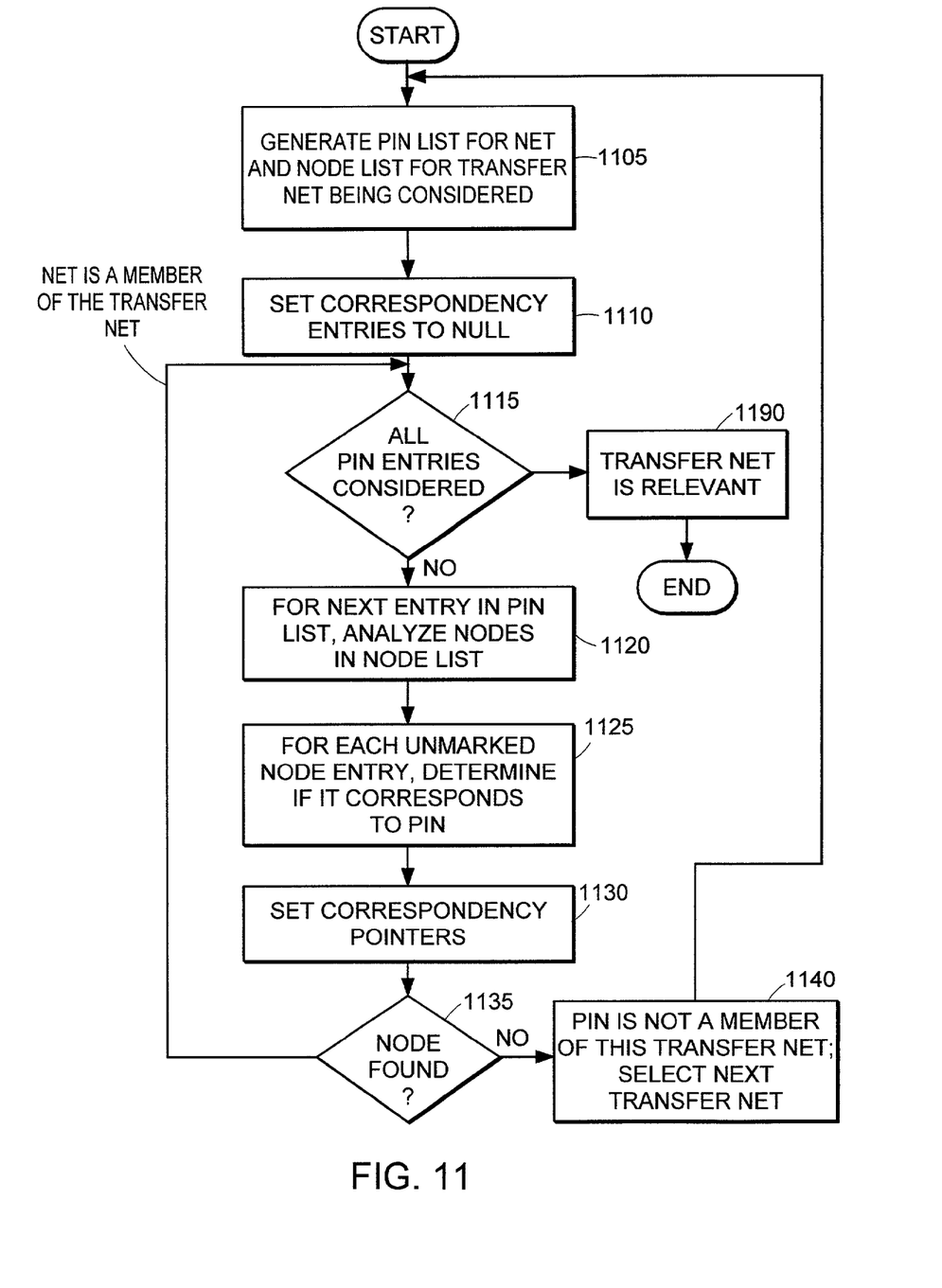
FIG. 11 is a flowchart illustrating exemplary logic to determine whether a transfer net in a transfer net list corresponds to an extended net according to certain embodiments of the invention.

FIG. 11 illustrates exemplary logic to determine if an extended net, e.g., Bus<0>, is a member of a transfer net, e.g., 705. This logic is but one exemplary way of implementing the logic of act 1010 referred to above in connection with FIG. 10. In act 1105, a list of node IDs 720 for the transfer net 705 being considered is generated, and a list of logical pins associated with the extended is created along with associated part IDs. The reference designators of the extended net may be mapped to corporate part numbers via a CAD parts list, and the corporate part number, in turn, may be mapped to a part ID via the part mapping data structure 800. The number of entries in each list is the number of nodes 710 in the transfer net 705. Each list entry includes a correspondence pointer data structure. Thus, the entries in the node list identify the nodes, e.g., cnode, mnode1, mnode2, mode, and each entry also contains a pointer to an entry in the pin list to point to a corresponding pin. Analogously, the entries in the pin list identify the pin and part ID and also contain pointers to entries in the node list to point to corresponding nodes.

In act 1110, the correspondence pointer entries in both lists are set to null, since correspondence has not yet been established.

The logic determines in act 1115 if all entries in the pin list have been processed.

If all entries have been processed, then all of the pins in the pin list map into nodes in the transfer net, and thus the transfer net being considered is relevant 1190 and the logic ends.

If all entries in the pin list have not been processed, then the next pin list entry is identified to be considered against the node list 1120. One exemplary way of identifying the next entry in the pin list is to iterate over the pin list sequentially, though there are numerous other iteration techniques that may be used.

In act 1125, the identified next pin entry is compared against the node list. More specifically, the logic iterates over the node list to find node entries with null correspondence pointers, and for such entries, the logic makes the following comparisons. First, the part ID associated with the pin is compared against the part ID 725 of a node 710. Second, the pindef 730 of a node 710 is analyzed to determine if it contains the pin name of the identified next pin.

The correspondence pointers are set accordingly in act 1130. Specifically, if the part IDs compare and the logical pin name is contained in the pindef 730 of the same node 710, then the correspondence pointer for the node entry is set to point to the pin entry being considered, and vice versa. If either the part IDs do not compare or the logical pin name is not contained in the pindef 730 of the same node 710, then the correspondence pointers remain null.

In act 1135, the logic checks if correspondence has been found for the pin being considered. If the pin being considered has been found to correspond to a node, the logic loops back to act 1115 to consider the next pin in the list. If the pin being considered is found to not correspond to any node 710 in the transfer net 705, then the logic determines in act 1140 that the pin is not a member of the transfer net 705 being considered, and consequently, the transfer net being considered does not correspond to the extended net of interest. The logic needs to start over and consider the next transfer net in the transfer net list.

The above logic repeats until all pins in the pin list are found to correspond to nodes in a node list, and vice versa. The logic of act 1190 checks that there are no null pointers in either the pin or node list to ensure that the mapping is a complete one-to-one mapping of pins and nodes.

Using the examples above, the extended net Bus<0> will have the following correspondence. Physical pin U1.1 will map to a part ID of CPU and a logical pin A0. This information in turn will map to node ID Cnode. Physical pin U2.A1 will map to part ID Memory and logical pin B0. This information in turn will map to node Mnode 1 (since this is the first instance in the node list with this information). Physical pin U3.D1 will map to a part ID of Register and a logical pin C10. This information in turn will map to node ID Rnode. Physical pin U4.A1 will map to a part ID of Memory and a logical pin A0. This information in turn will map to node ID Mnode 2 (since this is the second instance in the node list with this information). Neither the pin list corresponding to extended net Bus<0> nor the node list corresponding to transfer net 705 will have null pointers, and the logic will thus determine that Bus<0> corresponds to exemplary transfer net 705. Transfer net 705 may then be used to automate construction of simulations and analyses for extended net Bus<0>.

Though the description above started with the pin list and then iterated over the nodes to determine correspondence, the logic may easily be altered in other ways to determine correspondence. For example, the logic may start with the node list and iterate over the pin list. Likewise, though double reference pointers were used in the example above, flags may be used in its place to flag correspondence and/or single reference pointers and flags may be used.

Figure 12:
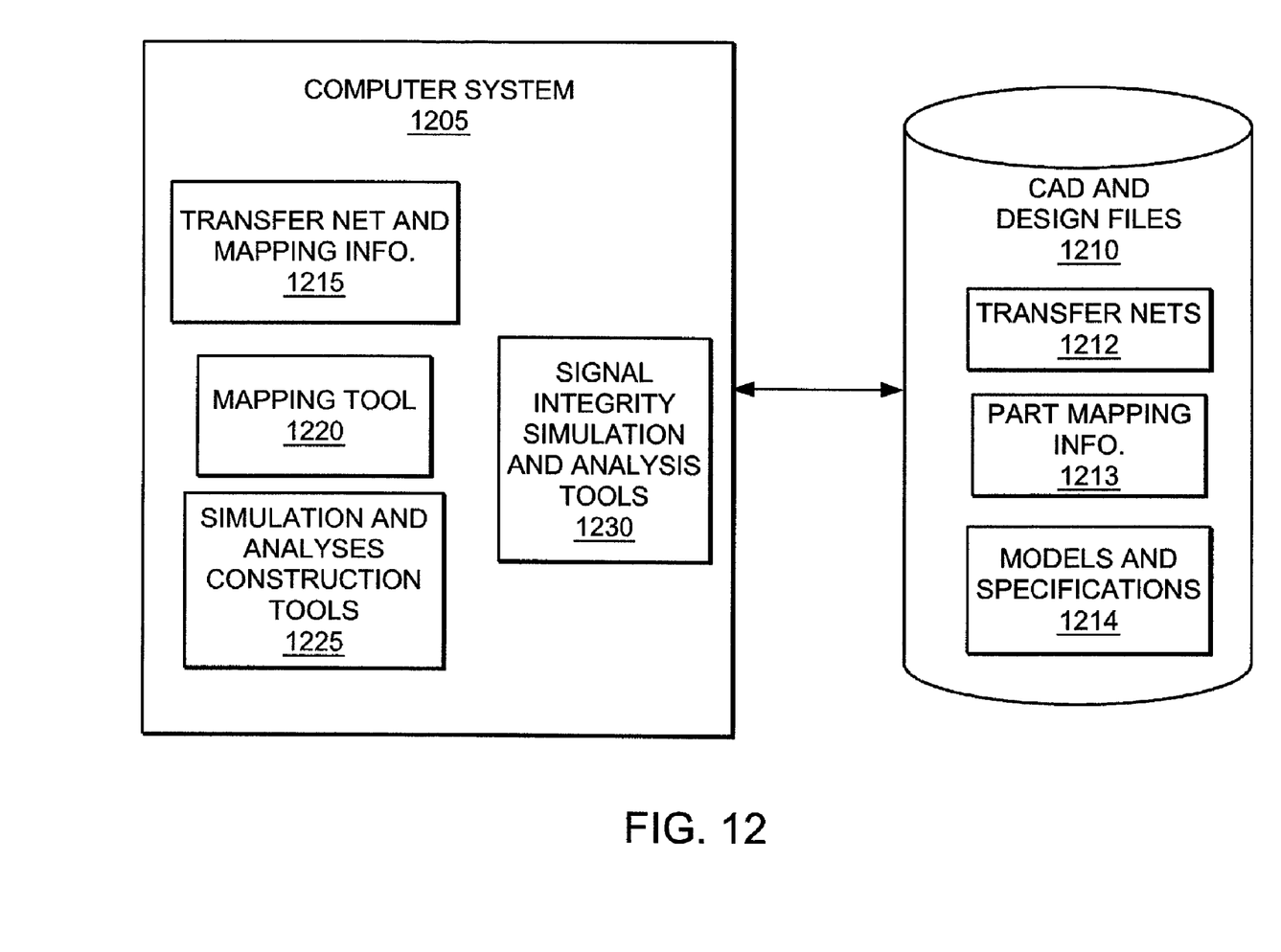
FIG. 12 illustrates an exemplary design system for executing and storing tools and data structures according to certain embodiments of the invention.

FIG. 12 illustrates an exemplary design system according to certain embodiments of the invention. A computer system 1205 is in communication with a CAD and Design Files 1210. The CAD and Design Files include conventional files for describing and modeling the physical behavior and connectivity of components. Files 1210 also include (a) transfer net information such as those described by example in connection with FIGS. 7A–B; (b) part mapping information 1213 described by example in connection with FIG. 8, and (c) various models and specifications 1213, including potentially modified IBIS models and files, such as those described by example in connection with FIG. 9. The computer system includes hardware (not shown) for executing various software applications and logic, including computer simulation programs, design tools, etc. It also includes transfer net and mapping information 1215, which may be a computer-usable form of information within information 1212 and 1213. The computer system 1205 further includes mapping tool logic 1220 for identifying relevant transfer nets from extended nets or vice versa, simulation and analyses constructions tools 1225, and signal integrity simulation and analysis tools 1230. The simulation construction tools utilize information from transfer net and mapping information 1215 from the mapping tool 1220 and from the Files 1210 (e.g., physical net lists and CAD parts lists) to construct and control the simulations.

The description above started with the identification of an extended net of interest and then used that information to identify the relevant transfer net. The relevant transfer net was then used construct appropriate signal integrity simulations and analyses. However, the transfer net descriptions may be used in the opposite direction as well. For example, a transfer net list may be used as the starting point, and the information contained therein may be mapped in analogous, but opposite, manner to determine the physical information of interest to create the simulations and analyses corresponding to the extended nets relevant to the transfers. Thus, a designer may wish to automatically simulate and analyze the relevant extended nets for a cache interface, yet not know which specific extended nets apply. Instead the designer might simply know that there is a relevant transfer net list for the cache interface.

Moreover, the above embodiments provided indirection between logical and physical pin names to facilitate re-use of transfer nets. It is believed for example that logical names in some sense are more stable. Microprocessor chips in a given family may have the same logical pin names and relevant transfers, though the physical names may change depending on packaging technology, for example. Though such indirection is desirable it is not necessary to enjoy the benefits afforded by modeling and using transfers according to embodiments of the invention. The relevant data structures for example and mapping logic may operate off of physical information instead of logical.

In certain embodiments, the transfer net descriptions are created by a designer. In some embodiments, however, it is foreseeable that transfer nets themselves may be automatically created as part of creating the design, e.g., analyzing RTL descriptions of interfaces.

In the above embodiments, IBIS files provided an association of logical pin names and physical pin numbers and this existing association was exploited. However, other embodiments may employ other ways of specifying such association, for example, if IBIS files aren't used.

In the above embodiments, nodes were characterized as source, receiver or other. This arrangement is useful for many forms of analyses. However, some analyses do not require identification of "other" and thus simpler embodiments of the invention may not need such characterization. For example, an embodiment that simply automates timing analysis may not need an "other" designation for nodes.

Though the description used examples that were relevant to electronic design, the inventions teaching extend to any system in which signal transfers may be modeled, including for example optical information systems.

In addition, the transfer nets described above provide a formalized description of transfers that among other things identifies sources and receivers. This information may be used to verify design libraries in CAD Files. For example, the information in a transfer net may be used to crosscheck the design libraries to see if the component libraries list certain pins as outputs that are identified as pins for source nodes by the transfer net. Analogously, component libraries may be checked to see if they list certain pins as inputs that are identified as pins for receiver nodes in a transfer net.

As used here, the term "driver" is similar in meaning to the term "source," and the term "receiver" is similar in meaning to the term "target."

It will be appreciated that the scope of the present invention is not limited to the above described embodiments, but rather is defined by the appended claims; and that these claims will encompass modifications of and improvements to what has been described.

What is claimed is:

1. A method of automatically creating computer simulations or analyses of signal transfers of a circuit or system design, comprising:

providing a description of a physical design of a circuit or system having physical components and in which at least one of the physical components may transfer a signal to at least one physical component, wherein the physical design description includes an identification of the physical components and information descriptive of physical inter-connectivity among the physical components;

providing a signal transfer description for at least one signal transfer, the signal transfer description including a set of source nodes and a set of receiver nodes, wherein the set of source nodes provide the signal to be transferred and the receiver nodes receive the signal transferred from the corresponding set of source nodes, and wherein each node is described by information associated with physical components;

identifying a signal transfer description as corresponding to at least a portion of the physical inter-connectivity information;

using information in the corresponding signal transfer description to construct computer simulations or analyses of the corresponding physical inter-connectivity.

2. The method of claim 1 wherein the node information associated with physical components includes a logical pin definition identifying logical pin names of the physical component.

3. The method of claim 1 wherein the node information associated with physical components includes a part identification suggestive of the functionality of the physical component.

4. The method of claim 3 wherein the node information is associated with a physical component via part mapping information and via a CAD parts list, wherein the part mapping information associates the part identification with a corporate part number, and wherein the CAD parts list associates a corporate part number with an identification of the physical component.

5. The method of claim 3 wherein the node information is associated with a physical component via part mapping information wherein the part mapping information associates the part identification with model information, and wherein the act of using information in the corresponding signal transfer description to construct computer simulations or analyses uses the node information to find corresponding model information to use in the computer simulations or analyses.

6. The method of claim 1 wherein the computer simulations or analyses include timing verification analyses of signal transfers to physical components corresponding to receiver nodes.

7. The method of claim 1 wherein the computer simulations or analyses include waveform analyses of signal transfers for all nodes in the signal transfer description.

8. The method of claim 1 wherein the computer simulations or analyses avoid analysis of false paths, wherein a false path is a path within the set of all possible signal paths defined by the physical inter-connectivity but which is not used in a signal transfer.

9. The method of claim 1 wherein the act of identifying a signal transfer description as corresponding to at least a portion of the physical inter-connectivity information includes the acts of determining a set of component pin identifications associated with the physical inter-connectivity information;

determining a corporate part number for the components associated with the component pin identifications;

determining if the signal transfer description includes a part ID associated with the corporate part number; and determining if the transfer description includes pin definition information containing the component pin identifications associated with the physical inter-connectivity information.

10. The method of claim 1 further including identifying physical inter-connectivity information of interest and using the identified inter-connectivity information when identifying a corresponding signal transfer description.

11. The method of claim 1 further including identifying a signal transfer description of interest and using the identified signal transfer description when identifying a corresponding physical inter-connectivity information.

12. The method of claim 1 wherein the signal transfer description includes other information representative of the data rate, whether a signal is a clock signal or a data signal, and whether a signal is single ended or differential, and wherein the other information is also used to construct computer simulations or analyses.

13. A system for automatically creating computer simulations or analyses of signal transfers of a circuit or system design, comprising:

a computer-readable description of a physical design of a circuit or system having physical components and in which at least one of the physical components may transfer a signal to at least one other physical component, wherein the physical design description includes an identification of the physical components and computer-readable information descriptive of physical inter-connectivity among the physical components;

a computer-readable signal transfer description for at least one signal transfer, the signal transfer description including a set of source nodes and a set of receiver nodes, wherein the set of source nodes provide the signal to be transferred and the receiver nodes receive the signal transferred from the corresponding set of source nodes, and wherein each node is described by information associated with physical components;

logic to identify a signal transfer description as corresponding to at least a portion of the physical inter-connectivity information;

logic, responsive to information in the corresponding signal transfer description, to construct computer simulations or analyses of the corresponding physical inter-connectivity.

14. The system of claim 13 wherein the node information associated with physical components includes a logical pin definition identifying logical pin names of the physical component.

15. The system of claim 13 wherein the node information associated with physical components includes a part identification suggestive of the functionality of the physical component.

16. The system of claim 15 wherein the node information is associated with a physical component via computer-readable part mapping information and via a computer-readable CAD parts list, wherein the part mapping information associates the part identification with a corporate part number, and wherein the CAD parts list associates a corporate part number with an identification of the physical component.

17. The system of claim 15 wherein the node information is associated with a physical component via computer-readable part mapping information, wherein the part mapping information associates the part identification with a computer-readable model information, and logic to construct computer simulations or analyses includes logic to analyze the node information to find corresponding model information to use in the computer simulations or analyses.

18. The system of claim 13 wherein the computer simulations or analyses include timing verification analyses of signal transfers to physical components corresponding to receiver nodes.

19. The system of claim 13 wherein the computer simulations or analyses include waveform analyses of signal transfers for all nodes in the signal transfer description.

20. The system of claim 13 wherein the computer simulations or analyses avoid analysis of false paths, wherein a false path is a path within the set of all possible signal paths defined by the physical inter-connectivity but which is not used in a signal transfer.

21. The system of claim 13 wherein the logic to identify a signal transfer description as corresponding to at least a portion of the physical inter-connectivity information includes logic to determine a set of component pin identifications associated with the physical inter-connectivity information;

logic to determine a corporate part number for the components associated with the component pin identifications;

logic to determine if the signal transfer description includes a part ID associated with the corporate part number; and logic to determine if the transfer description includes pin definition information containing the component pin identifications associated with the physical inter-connectivity information.

22. The system of claim 13 further including logic to identify physical inter-connectivity information of interest and logic, responsive to the identified inter-connectivity information, to identify a corresponding signal transfer description.

23. The system of claim 13 further including logic to identify a signal transfer description of interest and logic, responsive to the identified signal transfer description, to identify corresponding physical inter-connectivity information.

24. The system of claim 13 wherein the computer-readable signal transfer description includes other information representative of the data rate, whether a signal is a clock signal or a data signal, and whether a signal is single ended or differential, and wherein the logic to construct is responsive to the other information.

25. A computer program product for automatically creating computer simulations or analyses of signal transfers of a circuit or system design, wherein the computer program product includes computer-executable instructions on a computer-readable medium, the instructions being operable in a design system having a description of a physical design of a circuit or system having physical components and in which at least one of the physical components may transfer a signal to at least one other physical component, wherein the physical design description includes an identification of the physical components and information descriptive of physical inter-connectivity among the physical components, wherein the computer-executable instructions includes a first set of instructions having a signal transfer description for at least one signal transfer, the signal transfer description including a set of source nodes and a set of receiver nodes, wherein the set of source nodes provide the signal to be transferred and the receiver nodes receive the signal transferred from the corresponding set of source nodes, and wherein each node is described by information associated with physical components;

a second set of instructions for identifying a signal transfer description as corresponding to at least a portion of the physical inter-connectivity information;

a third set of instructions for using information in the corresponding signal transfer description to construct computer simulations or analyses of the corresponding physical inter-connectivity.

26. A computer program product having computer-readable information to describe a signal transfer description for at least one signal transfer, in which the signal transfer description includes a set of source nodes and a set of receiver nodes, and the set of source nodes provide the signal to be transferred and the receiver nodes receive the signal transferred from the corresponding set of source nodes, and wherein each node is described by information associated with a physical component of a circuit or system design as described in a physical CAD description.

27. A method of validating design libraries having information descriptive of physical components including information identifying input and output pins of a component, comprising:

providing a signal transfer description for at least one signal transfer for a circuit or system design, the signal transfer description including a set of source nodes and a set of receiver nodes, wherein the set of source nodes provide the signal to be transferred and the receiver nodes receive the signal transferred from the corresponding set of source nodes, and wherein each node is described by information associated with physical components;

identifying a physical component corresponding to a source node in the signal transfer description;

identifying a set of pins for the identified physical component that correspond to the source node;

verifying that all pins identified as corresponding to the source node are capable of being an output device;

identifying a physical component corresponding to a receiver node in the signal transfer description;

identifying a set of pins for the identified physical component that correspond to the receiver node; and verifying that all pins identified as corresponding to the receiver node are capable of being an input device.

* * * * *